(12) United States Patent
Edelstein et al.

(10) Patent No.: US 6,181,012 B1
(45) Date of Patent: Jan. 30, 2001

(54) COPPER INTERCONNECTION STRUCTURE INCORPORATING A METAL SEED LAYER

(75) Inventors: Daniel Charles Edelstein, New Rochelle; James McKell Edwin Harper, Yorktown Heights; Chao-Kun Hu, Somers; Andrew H. Simon, Fishkill; Cyprian Emeka Uzoh, Hopewell Junction, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/067,851

(22) Filed: Apr. 27, 1998

(51) Int. Cl.$^7$ ................................................. H01L 23/532
(52) U.S. Cl. ........................................... 257/762; 257/751
(58) Field of Search ...................... 257/762, 751; 438/687, 627, 643, 653, 927

(56) References Cited

U.S. PATENT DOCUMENTS

| | | | |
|---|---|---|---|
| 5,071,518 | * 12/1991 | Pan ........................................ | 205/122 |
| 5,077,005 | 12/1991 | Kato . | |
| 5,316,974 | 5/1994 | Crank . | |
| 5,354,712 | 10/1994 | Ho et al. . | |
| 5,510,651 | * 4/1996 | Maniar et al. ........................ | 257/762 |
| 5,545,927 | * 8/1996 | Farooq et al. ........................ | 257/762 |
| 5,549,808 | 8/1996 | Farooq et al. . | |
| 5,889,317 | * 3/1999 | Huang et al. ........................ | 257/762 |
| 5,891,802 | * 4/1999 | Tao et al. ............................ | 257/762 |
| 5,893,752 | * 4/1999 | Zhang et al. ........................ | 438/687 |
| 5,899,740 | * 5/1999 | Kwon ................................... | 438/627 |
| 5,904,565 | * 5/1999 | Nguyen et al. ...................... | 438/687 |
| 5,917,244 | * 6/1999 | Lee et al. ............................. | 257/762 |
| 5,939,789 | * 8/1999 | Kawai et al. ........................ | 257/762 |
| 5,968,333 | * 10/1999 | Nogami et al. ...................... | 438/687 |
| 5,969,422 | * 10/1999 | Ting et al. ........................... | 257/762 |

FOREIGN PATENT DOCUMENTS

| | | |
|---|---|---|
| 0 725439 A2 | 7/1996 | (EP) . |
| 0 751567 A2 | 2/1997 | (EP) . |
| 9 69522 | 11/1997 | (JP) . |

* cited by examiner

*Primary Examiner*—David Hardy
(74) *Attorney, Agent, or Firm*—Robert Trepp; Randy Tung

(57) ABSTRACT

The present invention discloses an interconnection structure for providing electrical communication with an electronic device which includes a body that is formed substantially of copper and a seed layer of either a copper alloy or a metal that does not contain copper sandwiched between the copper conductor body and the electronic device for improving the electromigration resistance, the adhesion property and other surface properties of the interconnection structure. The present invention also discloses, methods for forming an interconnection structure for providing electrical connections to an electronic device by first depositing a seed layer of copper alloy or other metal that does not contain copper on an electronic device, and then forming a copper conductor body on the seed layer intimately bonding to the layer such that electromigration resistance, adhesion and other surface properties of the interconnection structure are improved.

30 Claims, 3 Drawing Sheets

COPPER INTERCONNECTION STRUCTURE INCORPORATING A METAL SEED LAYER

FIELD OF THE INVENTION

The present invention generally relates to an interconnection structure for providing electrical communication with an electronic device, and method for fabricating such structure and more particularly, relates to an interconnection structure for providing electrical connections to an electronic device by the incorporation of a copper alloy seed layer sandwiched in between a copper conductor body and an electronic device for improving the electromigration resistance, the adhesion and the surface properties of the interconnection structure.

BACKGROUND OF THE INVENTION

The technology of making interconnections to provide for vias, lines and other recesses in semiconductor chip structures, flat panel displays, and package applications has been developed for many years. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing, possible diffusion into the silicon during annealing which leads to contact and junction failure, and electromigration. Consequently, a number of aluminum alloys have been developed which provided advances over pure aluminum. For instance, U.S. Pat. No. 4,566,177 discloses a conductive layer of an alloy of aluminum containing up to 3% by weight of silicon, copper, nickel, chromium and manganese was developed to improve electromigration resistance. U.S. Pat. No. 3,631,304 discloses aluminum alloys with aluminum oxide which were also used to improve electromigration resistance.

Recently developed ULSI technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter using pure copper for its desirable high conductivity.

In the formation of ULSI interconnection structures such as vias and lines, copper can be deposited into such recesses to interconnect semiconductor regions or devices located on the same substrate. However, copper is known to have problems at semiconductor device junctions due to its low electromigration resistance. The electromigration phenomenon occurs when the superposition of an electric field onto random thermal diffusion in a metallic solid causes a net drift of ions in the direction of the electron flow. Any diffusion of copper ions into the silicon substrate can cause device failure. In addition, pure copper does not adhere well to oxygen containing dielectrics such as silicon dioxide and polyimide. To fully utilize copper in interconnection technology, the adhesion properties of copper must also be improved.

U.S. Pat. No. 5,130,274, assigned to the common assignee of the present invention, discloses the use of a copper alloy containing an alloying element of less than 2 atomic % by first depositing an alloy into the recess of an interconnection structure and then forming a copper alloy plug and a thin layer of an oxide of the alloying element on the exposed surface of the plug. However, the technique still does not satisfy the more stringent requirements in ULSI structures where critical dimensions of less than 0.5 $\mu$m place a considerable burden on thin film chip interconnections. The use of standard Al (Cu) alloy and a silicon dioxide dielectric in a deep-submicron logic circuit wiring structure results in a large circuit delay caused mainly by the wiring connections.

The use of Cu as an alternative material to Al (Cu) in ULSI wiring structures to increase the chip speed has been attempted by others. However, numerous problems are incurred in CU interconnections such as the tendency of Cu to corrode and the fast surface diffusion rates of copper in thin films. It is known that pure Cu has a smaller electromigration activation energy, i.e., 0.5~0.8 eV, than that in Al (Cu) of 0.8~0.9 eV. This implies that the advantage of using Cu for reducing interconnection electromigration failure at chip operating conditions is largely compromised.

A schematic of an enlarged, cross-sectional view of an electronic structure that utilizes conventional interconnections, made of copper alloy is shown in FIG. 1. The electronic structure 10 contains two levels of copper interconnections 12, 16 and one stud level 14 illustrating a copper wiring structure by a Damascene process on a pre-fabricated device 20. The device 20 is built on a semiconducting substrate 24. As shown in FIG. 1, a typical Damascene level is first fabricated by the deposition of a planar dielectric stack 26. The dielectric stack 26 is then patterned and etched using standard lithographic and dry etch techniques to produce a desired wiring or via pattern. The process is then followed by the metal depositions of a thin adhesion/diffusion liner 18 and copper alloy metallurgy 12 wherein a bottom silicon nitride layer 28 is used as a diffusion barrier that is previously deposited on top of the device 20 to protect against copper diffusion. After the copper alloy interconnection 12 is formed, a top silicon nitride layer 32 is deposited as an etch stop layer for defining the next level copper interconnection 14. After a second level dielectric stack 34 is deposited, a recess for an interconnect is etched into the dielectric layer 34 and the silicon nitride layer 32.

An interlevel copper alloy stud 14 with liner 22 is then deposited by a technique similar to that used in depositing the first level copper alloy interconnection 12. A variety of metal deposition techniques can be used for filling the trench or via. These techniques include a collimated sputtering process, an ion cluster beam process, an electron cyclotron resonance process, a chemical vapor deposition process, an electroless plating process and an electrolytic plating process. Other techniques such as a co-deposition method in which copper and an alloying element are co-deposited can also be used in forming the copper alloys. For instance, such co-deposition methods include co-sputtering, co-plating, co-chemical vapor deposition and co-evaporation. After the completion of the interlevel copper alloy stud 14, another similar process is repeated to form the second level copper interconnection 16 with liner 24 in a third dielectric stack layer 38. An etch stop layer 36 of silicon nitride is utilized between the stud and the second level interconnections. Finally, a top silicon nitride layer 42 is deposited on top of the copper wiring structure 10 for protecting the device from the environment.

Other workers have attempted to use copper alloys in providing enhanced electromigration resistance. For instance, U.S. Pat. No. 5,023,698 teaches copper alloys containing at least one alloying element selected from the group of Al, Be, Cr, Fe, Mg, Ni, Si, Sn and Zn. U.S. Pat. No. 5,077,005 teaches copper alloys containing at least one member selected from In, Cd, Sb, Bi, Ti, Ag, Sn, Pb, Zr and Hf where the weight percent of the alloying element used is between 0.0003 to 0.01. The copper alloys are used in TAB processes and as print circuit board members. U.S. Pat. No. 5,004,520 also teaches copper foil for film carrier application containing at least one alloying element selected from P, Al, Cd, Fe, Mg, Ni, Sn, Ag, Hf, Zn, B, As, Co, In, Mn, Si, Te, Cr and Zn with the alloying element concentrations from 0.03 to 0.5 weight percent. The alloys are used as connecting leads in integrated circuit chip mounting. Furthermore, U.S. Pat. No. 4,749,548 teaches copper alloys containing at least one alloying element selected from Cr, Zr, Li, P, Mg, Si, Al, Zn, Mn, Ni, Sn, Ti, Be, Fe, Co, Y, Ce, La, Nb, W, V, Ta, B, Hf, Mo and C. The alloying elements are used to increase the strength of the copper alloy. U.S. Pat. Nos. 5,243,222 and 5,130,274 teach copper alloys for improved adhesion and formation of diffusion barriers. However, none of these prior work teaches copper alloys that are sufficiently improved for use in ULSI on-chip or off-chip wiring interconnections to meet the electromigration resistance and the adhesion property requirements. Interconnection structures on ULSI devices must provide dense, fully continuous metal wiring in insulator structures with features much less than 0.5 $\mu$m in width, and with aspect ratios higher than 1.

It is therefore an object of the present invention to provide an interconnection structure of copper alloy that does not have the drawbacks and shortcomings of conventional copper interconnection structures.

It is another object of the present invention to provide an interconnection structure of a copper alloy that has improved electromigration resistance, adhesion properties and other surface properties.

It is a further object of the present invention to provide an interconnection structure of copper alloy that utilizes a seed layer at the interface between a copper alloy interconnection body and an electronic device it is connected to.

It is another further object of the present invention to provide an interconnection structure of copper alloy by incorporating a copper alloy seed layer sandwiched in between a copper conductor body and an electronic device to which the interconnection is connected.

It is still another object of the present invention to provide an interconnection structure of copper alloy by depositing a copper alloy seed layer prior to the formation of the copper conductor body which contains at least one element of Sn, In, C, Ti, Zr, N, O, Cl or S for improving the electromigration resistance of the interconnection structure.

It is yet another object of the present invention to provide an interconnection structure of copper alloy by depositing a copper alloy seed layer prior to the formation of the copper conductor body which includes at least one element selected from Al, Mg, Be, Ca, Sr, Ba, Sc, Y, La, Ce, Pr, Nd, Sm, Eu, Gd, Tb, Dy, Ho, Er, Tm, Yb, Lu, another further object of the present invention to provide an interconnection structure of copper alloy by utilizing a copper alloy seed layer which contains at least one element selected from B, N, P, Fe, Ru, Os, Co, Rh, Ir, Ni, Pd, Pt, Ag, Au, Zn or Cd for improving the surface properties of the interconnection structure.

It is still another further object of the present invention to provide an interconnection system of copper alloy by depositing a metal seed layer sandwiched between a copper conductor body and an electronic device of a metal selected from Ag, Mo, W or Co to improve the copper conductor deposition process.

It is still another further object of the present invention to provide a method for forming an interconnection structure by first depositing a copper alloy seed layer on an electronic device and then forming a copper conductor body on the seed layer such that electromigration resistance corrosion resistance and adhesion of the interconnection structure are improved wherein the seed layer includes copper and at least one element selected from the group consisting of Sn, In, Zr, Ti, C, O, N, Cl and S.

SUMMARY OF THE INVENTION

In accordance with the present invention, an interconnection structure of copper alloy that has improved. electromigration resistance, adhesion properties and other surface properties is provided by utilizing an additional copper alloy seed layer sandwiched between the copper conductor body and the electronic device.

In a preferred embodiment, an interconnection structure for providing electrical communications with an electronic device is provided which includes a body that is formed substantially of copper and a copper alloy seed layer sandwiched in between and in intimate contact with the body and the electronic device for improving electromigration resistance of the interconnection structure. The copper alloy seed layer is formed by copper and at least one element of Sn, In, Zr, Ti, C, O, N, Cl or S.

In another preferred embodiment, an interconnection structure for providing electrical connection to an electronic device is provided which includes a copper conductor body and a copper alloy seed layer sandwiched in between and in intimate contact with the copper conductor body and a diffusion barrier layer formed on the electronic device for improving adhesion to the underlying diffusion barrier layer, the copper alloy seed layer consists of copper and at least one element selected from the group consisting of Al, Mg, Be, Ca, Sr, Ba, Sc, Y, La, Ce, Pr, Nd, Sm, Eu, Gd, Tb, Dy, Ho, Er, Tm, Yb, Lu, Hf, V, Nb, Ta, Cr, Mo, W, Mn, Re, Si and Ge.

In still another preferred embodiment, an interconnection system for providing electrical connection to an electronic device is provided which includes a copper conductor body and a copper alloy seed layer sandwiched in between and in intimate contact with the copper conductor body and the electronic device for improving the surface properties of the electronic device, the copper alloy seed layer consists of copper and at least one element of B, O, N, P, Fe, Ru, Os, Co, Rh, Ir, connection system for providing electrical communication with an electronic device is provided which includes a copper conductor body and a metal seed layer sandwiched in between and in intimate contact with the copper conductor body and the electronic device for improving the copper conductor deposition process, the metal seed layer is deposited of a metal which has a solubility in copper so low such that substantially no copper compounds can be formed. In general, the metal has an electrical resistivity substantially similar to the electrical resistivity of copper. A suitable metal for the metal seed layer is Ag, Mo, W or Co.

The present invention is further directed to a method for forming an interconnection structure for providing electrical connection to an electronic device which can be carried out by the operating steps of first depositing a copper alloy seed layer on an electronic device, and then forming a copper conductor body on the copper alloy seed layer intimately bonding to the layer such that electromigration resistance of the interconnection structure is improved.

The present invention is further directed to a method for forming an interconnection structure for providing electrical communication with an electronic device that has improved adhesion with the device which can be carried out by the steps of first depositing a copper alloy seed layer on the electronic device, the seed layer consists of copper and at least one element of Al, Mg, Be, Ca, Sr, Ba, Sc, Y, La, Ce, Pr, Nd, Sm, Eu, Gd, Tb, Dy, Ho, Er, Tm, Yb, Lu, Hf, V, Nb, Ta, Cr, Mo, W, Mn, Re, Si or Ge, and then forming a copper conductor body in intimate contact with the copper alloy seed layer.

The present invention is further directed to a method for forming a conductor for providing electrical communication with an electronic device which can be carried out by the steps of first depositing a copper alloy seed layer on the electronic device to improve the surface properties of the device, the copper alloy seed layer consist of copper and at least one element of B, O, N, P, Fe, Ru, Os, Co, Rh, Ir, Ni, Pd, Pt, Ag, Au, Zn or Cd, and then forming a conductor on top of and in intimate contact with the copper alloy seed layer. The conductor is formed of copper and between about 0.01 and about 10 weight percent of at least one alloy element of C, N, O, Cl or S.

The present invention is further directed to a method for forming a conductor for providing electrical communication with an electronic device which can be carried out by the steps of first depositing a metal seed layer on top of the electronic device, the metal seed layer is deposited of a metal that has a solubility in and an affinity with copper so low such that no copper compound can be formed, and then forming a copper conductor body on top of and in intimate contact with the metal seed layer. The metal seed layer can be deposited of a metal selected from Ag, Mo, W or Co.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention provides a novel interconnection structure for establishing electrical communication to an electronic device by utilizing a copper conductor body and a copper alloy seed layer sandwiched between the conductor body and the electronic device such that the electromigration resistance, the adhesion property and other surface properties are improved. The present invention also discloses an interconnection structure for providing electrical connection to an electronic device by utilizing a copper conductor body and a metal seed layer sandwiched between the conductor body and the electronic device for improving the copper conductor deposition process in which the metal seed layer is deposited of a material of Ag, Mo, W or Co.

The present invention further discloses a novel method for forming an interconnection structure for providing electrical communication with an electronic device that has improved adhesion with the device by first depositing a copper alloy seed layer onto the electronic device prior to the formation of a copper conductor body on top of the seed layer. The seed layer can be formed by copper and at least one element of Al, Mg, Be, Ca, Sr, Ba, Sc, Y, La, Ce, Pr, Nd, Sm, Eu, Gd, Tb, Dy, Ho, Er, Tm, Yb, Lu, Hf, V, Nb, Ta, Cr, Mo, W, Mn, Re, Si or Ge. A similar method for forming an interconnection structure that has improved electromigration resistance of the structure is provided by utilizing a copper alloy seed layer deposited by a copper and at least one alloying element of Sn, In, Zr, Ti, C, O, N, Cl or S. Another similar method for forming a conductor for providing electrical communication with an electronic device that has improved surface properties on the electronic device is provided by utilizing a copper alloy seed layer consisting of copper and at least one element of B, O, N, P, Fe, Ru, Os, Co, Rh, Ir, Ni, Pd, Pt, Ag, Au, Zn or Cd. The present invention novel method for forming a conductor to provide electrical communication with an electronic device can be further carried out by utilizing a seed layer that does not contain copper, i.e., a metal seed layer that is deposited of a metal having a solubility and an affinity with copper so low such that no copper compound can be formed, for instance, a metal of Ag, Mo, W or Co.

Figure 1:
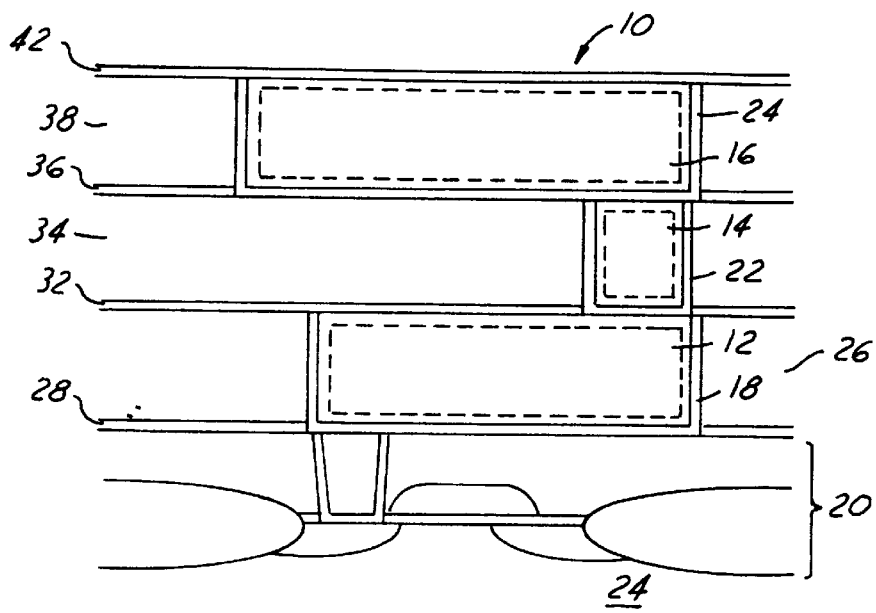
FIG. 1 is an enlarged, cross-sectional view of a conventional interconnection system utilizing copper alloy.
Figure 2:
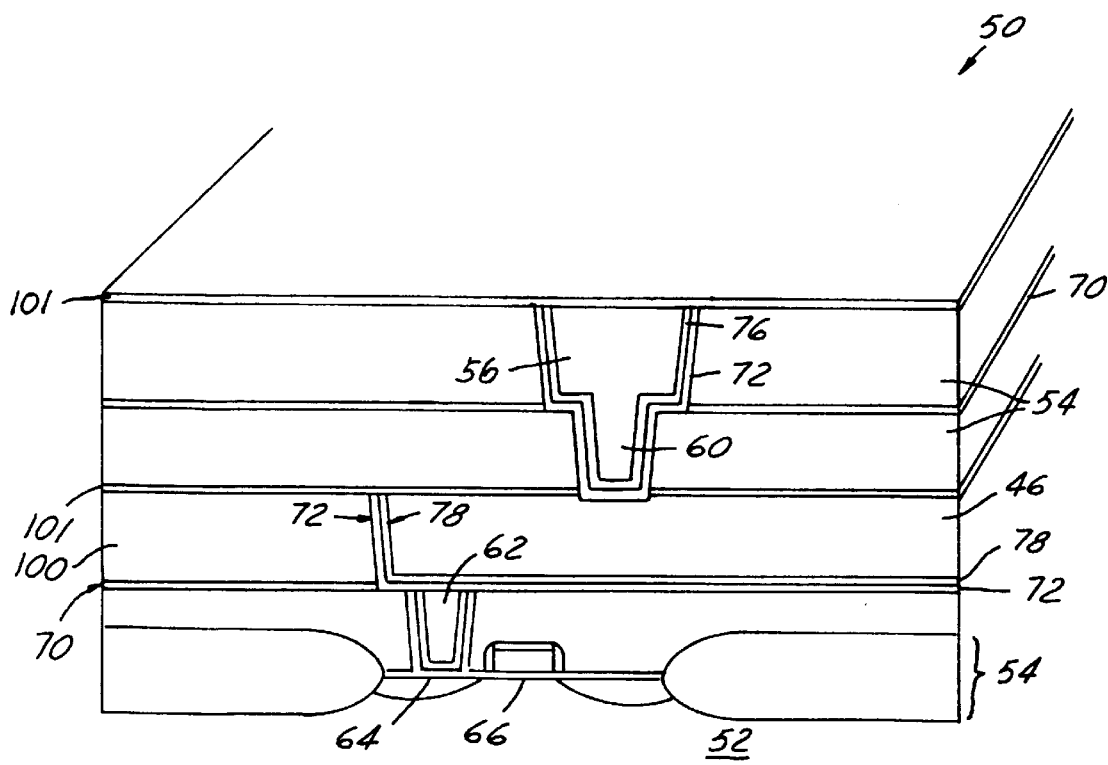
FIG. 2 is an enlarged, perspective view of an electronic structure having the present invention interconnection system built therein.

Referring now to FIG. 2, wherein an enlarged, perspective view of a present invention interconnection structure 50 is shown. The interconnection structure 50 is built on a substrate 52 which may be silicon or other semiconductor material in which electronic devices are contained. The device 66 with W studs and local interconnections 62 are built on a semiconducting substrate 52. Vertical connections between wiring levels are provided by Cu stud structure 60 and W stud structure 62 which connect the wiring to the device contact 64. The device 66 shown generally represents a CMOS transistor, but may be any electronic device.

To prevent diffusion of copper into the insulators 54 or device 66, diffusion/adhesion barrier layers are normally used to surround the copper 46, 60, and 56. The diffusion/adhesion barrier layers may be insulating layers 70 or conducting layers 72. The conducting diffusion barrier layer 72 also provides adhesion for the copper to the underlying materials, even though they are referred to as simply in this document as the barrier layer. Also shown in FIG. 2, are the seed layers 76 and 78 which are normally deposited under the main copper conductor layers 46, 60 and 56. The locations and functions of the seed layers are described in reference to two methods of fabricating the interconnection structures, i.e., a single Damascene process and a dual Damascene process.

Figure 3A:
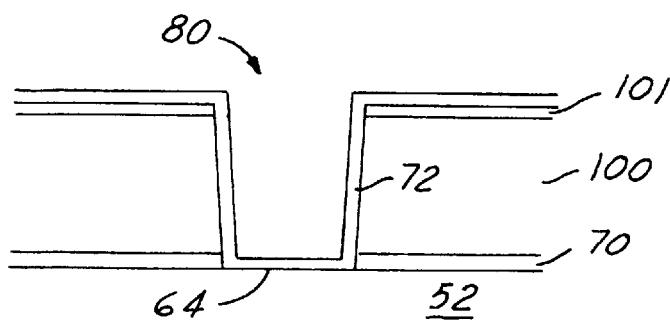
FIG. 3A is an enlarged, cross-sectional view of an opening for forming a present invention interconnection system having a diffusion barrier layer deposited therein.
Figure 3B:
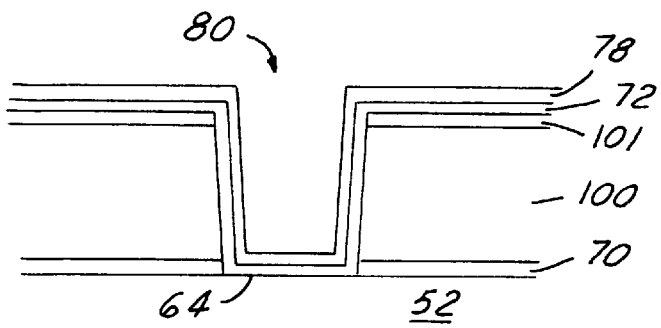
FIG. 3B is an enlarged, cross-sectional view of the opening for forming the present invention interconnection system of FIG. 3A having a copper alloy seed layer deposited therein.

A single Damascene process for fabricating the present invention novel interconnection structure is shown in FIGS. 3A–3D. In FIG. 3A, the structure of a line or stud 46 is shown. An insulator layer 100 and a diffusion/adhesion barrier layer 101 is first deposited and patternee omitted. The liner layer 72 is deposited on top of a nitride etch stop layer 101. This is a fabrication method known as a single Damascene process. Next, a seed layer 78 is deposited over the barrier layer 72, as shown in FIG. 3B. The material used for the seed layer and its deposition method are given in a latter section since different materials may be preferred for achieving different property enhancements.

Figure 3C:
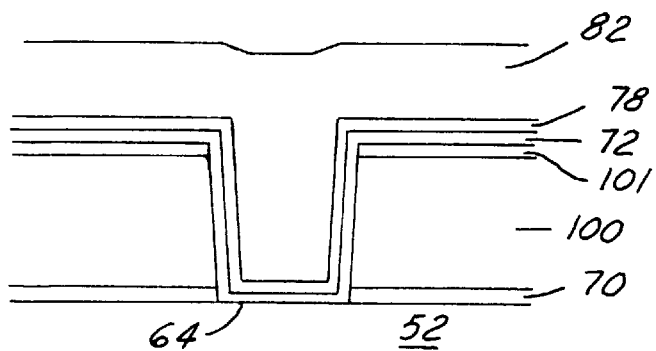
FIG. 3C is an enlarged, cross-sectional view of the opening for forming the present invention interconnection system of FIG. 3B having a copper conductor material deposited therein.
Figure 3D:
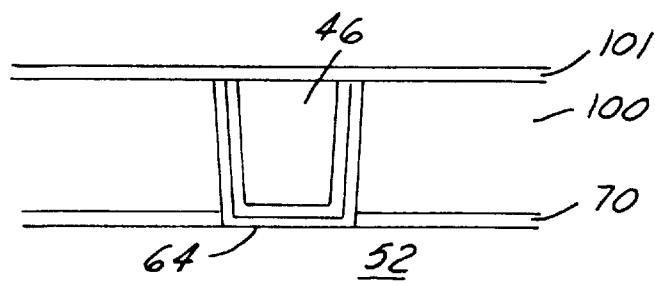
FIG. 3D is an enlarged, cross-sectional view of the present invention interconnection system of FIG. 3C having the excess copper removed.

The function of the seed layer 78 is to provide a base onto which a main conductor layer may be deposited. This is shown in FIG. 3C, wherein a main conductor layer 82 is deposited on top of the seed layer 78. To complete the wiring step in the single Damascene process, the excess copper is planarized by a method such as chemical mechanical polishing such that the excess top surface main conductor 82, seed layer 78 and barrier layer 72 are removed, while leaving an isolated stud or line 46. Finally, an insulator barrier layer is deposited as shown in FIG. 3D. This same procedure can be repeated for the next wiring level and/or studs to build a multi-level interconnection structure.

Figure 4A:
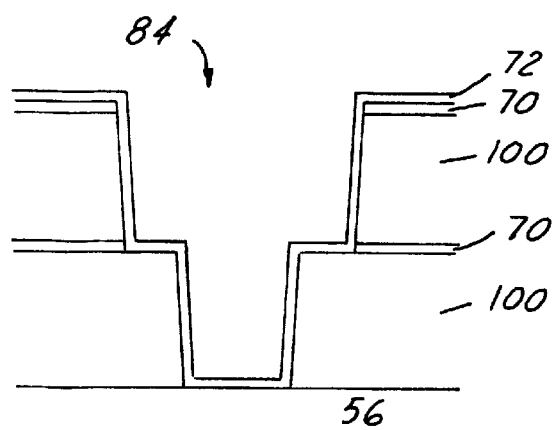
FIG. 4A is an enlarged, cross-sectional view of an opening for forming the present invention interconnection system of a dual-Damascene structure having a diffusion barrier layer deposited therein.
Figure 4B:
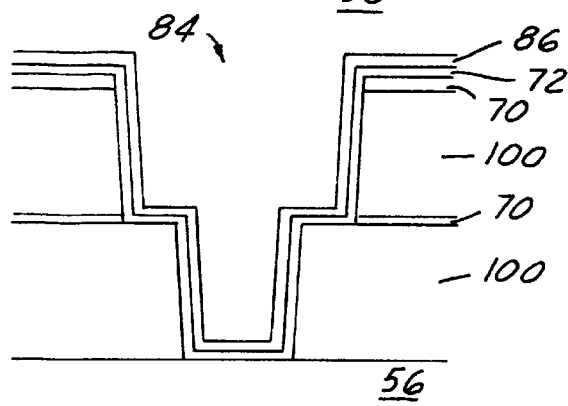
FIG. 4B is an enlarged, cross-sectional view of the opening for forming the present invention interconnection structure of FIG. 4A having a copper alloy seed layer deposited on top of the diffusion barrier layer.
Figure 4C:
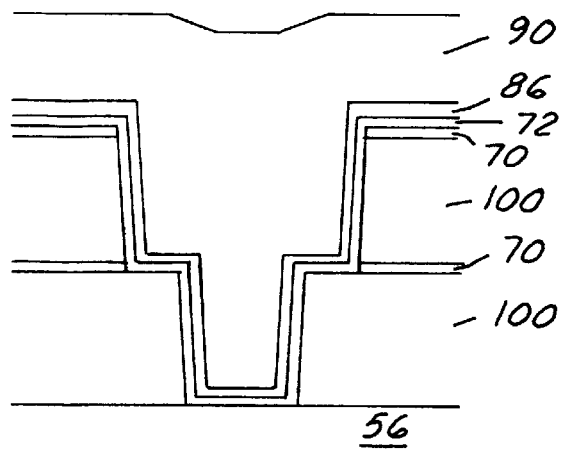
FIG. 4C is an enlarged, cross-sectional view of the opening for forming the present invention interconnection structure of FIG. 4B having a copper alloy deposited therein.
Figure 4D:
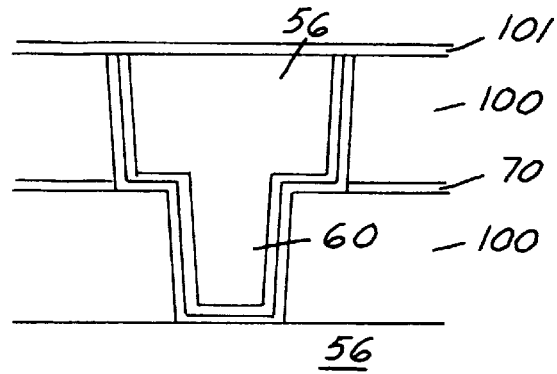
FIG. 4D is an enlarged, cross-sectional view of the present invention interconnection structure of FIG. 4C having the excess copper removed.

In a second method of fabricating the present invention novel interconnection system, commonly known as a dual-Damascene process, both a stud and a line level are fabricated in the same process step, for instance, as shown in FIG. 2, the line level 56 and the stud 60. Referring now to FIG. 4A wherein a barrier layer 72 is first deposited into a combined line/stud opening 84. In the next step of the process, a seed layer 86 is deposited on top of the barrier layer 72, as shown in FIG. 4B. A main conductor layer 90 is then deposited to fill the line/stud opening 84. This is shown in FIG. 4C. A planarization step, by a technique such as chemical mechanical polishing is then carried out to complete the wiring structure of line 56 and stud 60 together. It should be noted that, in this dual-Damascene process, a silicon nitride etch stop layer 70 is used both in forming the line 56 and the stud 60, or can be omitted. A final passivation and etch stop layer silicon nitride layer 101 is deposited, as shown in FIG. 4D.

The seed layer utilized by the present invention novel interconnection structure serves several desirable functions. For instance, in a chemical vapor deposition process for a main copper conductor, a seed layer is desirable for the initiation of chemical reactions which lead to the deposition of copper. For an electroplating process for forming a main copper conductor, a seed layer is desirable to provide electrical continuity to the electrodes which supply the plating current. For a high temperature reflow sputtering or chemical vapor deposition process for a main copper conductor, a thin layer is desirable for providing a surface with good wetting and nucleation growth characteristics.

The main copper conductor body is typically formed not of pure copper, but of a mixture of copper with an alloying element such as C, N, O, Cl or S which have been shown to improve the reliability of the copper conductor, or an alloy of copper with other metals which have also been shown to improve the reliability. The above alloying element in the alloy may be in the range from about 0.001 wt. % to about 10 wt. %.

The present invention novel seed layer for depositing a copper conductor body can be formed of a copper alloy or other metals that does not contain copper. By the appropriate selection of the alloy seed layer composition, the seed layer can have the properties which are needed for high quality deposition of the copper conductor body, while not degrading the reliability of the overall composite conductor. The composition and structure of a seed layer do not have to be the same as the composition and structure of the main conductor copper body. For instance, the seed layer may be an alloy with a higher electrical resistivity than the main conductor copper. Furthermore, the seed layer alloy may not even contain copper. As long as the cross-sectional area occupied by the seed layer is a small fraction of the entire conductor cross-sectional area, the overall line resistance will be determined by the resistivity of the main conductor and thus, not increased undesirably by the seed layer. It should also be noted that the current "metal alloy" used in this application includes metal compounds, as well as solid solutions or two-phase mixtures of metal phases.

The present invention novel seed layer can therefore be chosen to provide improved electromigration resistance, improved adhesion to the underlying diffusion barrier layer, and improved surface properties suitable for deposition of the main conductor copper body. The novel compositions of copper alloys which have been shown to improve the electromigration resistance relative to pure copper include Cu (Sn), Cu (In), Cu (Zr), Cu (Ti) and Cu (C, N, O, Cl, S). The present invention novel interconnection structure also utilizes copper alloys as seed layers which improve the adhesion properties relative to pure copper which include Cu (Al), Cu (Mg), and alloys of Cu with other reactive metals such as Be, Ca, Sr, Ba, Sc, Y, La, and rare earth series elements of Ce, Pr, Nd, Sm, Eu, Gd, Tb, Dy, Ho, Er, Tm, Yb and Lu, and Hf, V, Mb, Ta, Cr, Mo, W, Mn, Re, Si and Ge.

The present invention novel interconnection structure further utilizes additional alloying elements which improve surface properties for the seed layer including B, O, N, P, Fe, Ru, Os, Co, Rh, Ir, Ni, Pd, Pt, Ag, Au, Zn and Cd. It has been found that copper alloys which provide a surface suitable for deposition of the main conductor copper body include those which do not form an excessive amount of surface oxide. Therefore, the alloy seed layer may be formed from copper together with one or more of the above alloying elements in order to obtain the best combination of electromigration resistance, adhesion and surface properties. A typical example of the present invention is a copper alloy with 0.25 to 1.5 atomic % Sn or In. The electromigration life time of Cu (Sn) or Cu (In) greatly exceeds that of pure Cu. It is also possible to interdiffuse Cu, Sn or In, and to cumulate Sn or In at the Cu surface in the temperature range of 300–450° C.

In a second preferred embodiment of the present invention novel interconnection structure, a metal alloy seed layer which does not contain copper can be advantageously used. The properties of the metal alloy seed layer must meet the requirements of seeding the main copper deposition process while not introducing any contamination or compound formation which would increase the resistivity of the main copper conductor body. A specific example is Ag, which has low solubility in Cu and forms no Cu compounds. In addition, Ag has low resistivity that is comparable to the main copper conductor. Other metals and alloys of some metals which have low solubility in Cu and form no copper compounds which can be advantageously used in the present invention second preferred embodiment include Mo, W and Co.

In a third preferred embodiment of the present invention novel interconnection structure, a seed layer that is the same layer as the barrier layer may also be utilized. The properties of the seed layer must meet the requirements of adequate adhesion and diffusion barrier effectiveness plus providing the seeding properties of the normally separated seed layer.

In still another preferred embodiment of the present invention novel interconnection structure, the barrier layer and the seed layer can be structured such that their properties are graded from one interface to the other. For instance, the composition and structure would be optimized for adhesion at the bottom interface by including, for example, reactive metal constituents. In the middle of the barrier/seed layer, the composition and structure are optimized for diffusion barrier effectiveness by including, for example, refractory metal nitrides with amorphous microstructure. At the top surface of the barrier/seed layer, the composition and structure are optimized for seeding and adhesion of the main copper conductor body by including, for example, copper or silver. It should be obtained by either a sequential deposition of layers, or by deposition of a graded composition structure in one deposition process.

The present invention advantageous alloy seed layer may be fabricated by many different methods. In general, the seed layer will be deposited onto an underlying barrier layer, which may contain materials such as Ti, Nb, Mo, Ta, TaN, W, WN, TiN, TaSiN, WSiN, TiAlN, TiSiN. The seed layer may be deposited by reactive or non-reactive sputtering from a single alloy target or from multiple targets, by ionized sputtering which directs ionized species to the substrate, by chemical vapor deposition, by evaporation, or by electrochemical means. The alloy seed layer may also be deposited by a sequential deposition of copper and the alloying element, which may then be interdiffused by an appropriate heating treatment.

A suitable thickness for the present invention novel seed layer may range from several monolayers at smaller than 1 nm, i.e., 0.1 nm, up to about 100 nm in submicrometer line widths, or up to about 20% of the line width in wider lines. A preferred range for the thickness is between about 1 nm and about 100 nm.

EXAMPLE

A specific example of the present invention novel metal alloy seed layer is a structure containing a seed layer of copper alloy with 0.25 to 1.5 atomic % Sn or In. As shown in FIGS. 2, 3A~3D, the interconnection structure may have a main body conductor dimensions of less than 0.5 $\mu$m line width at the lower wiring levels, and less than 1–2 $\mu$m at the higher levels. The thickness of the interlevel insulators may be less than 1 $\mu$m or more than 1 $\mu$m, for instance, typically 0.5~1.5 $\mu$m. These insulator materials may typically contain Si and O, and may contain F, may be polymeric material and may be porous. The insulating diffusion barrier layer may be typically between 10 nm and 100 nm thick, and may typically contain Si and N, or may be polymeric materials. The conducting diffusion barrier layer may have a thickness of about 10 nm, or in the range of several nm to 100 nm. It may contain Ta, Ti, W, Nb, Mo, Si, N, Cl, O and may be amorphous or polycrystalline. For example, TaN, TiN or TaSiN may be suitably used.

The present invention seed layer may be an alloy of Cu with 0.25 to 1.5 atomic % Sn deposited by sputtering from an alloy target. Its thickness may be in the range between about 0.1 nm to about 100 nm, and more preferably between about 1 nm to about 100 nm. The main copper conductor body may be deposited by chemical vapor deposition or by electrochemical means, and may have an overall thickness between about 0.2 $\mu$m and about 1.5 $\mu$m. After a planarization process is carried out by a chemical mechanical polishing method, the excess copper, seed layer and diffusion/adhesion layers can be removed. The sequence of fabrication in the dual Damascene process is essentially the same as the single Damascene process for the barrier, the seed and the main copper conductor materials, with the exception that both the wiring level and stud level are completed in one process sequence.

It should be noted that while the present invention has been illustrated in the above example, alloy seed layers for copper interconnections may be advantageously used by any semiconductor structures in advanced chip applications or display applications.

While the present invention has been described in an illustrative manner, it should be understood that the terminology used is intendeore, while the present invention has been described in terms of several preferred embodiments, it is to be appreciated that those skilled in the art will readily apply these teachings to other possible variations of the inventions.

The embodiment of the invention in which an exclusive property or privilege is claimed are defined as follows:

1. An interconnection structure for providing electrical connections to an electronic device comprising:
   a body formed of copper and between about 0.001 and about 10 weight percent of at least one alloying element selected from the group consisting of C, N, Cl, O and S, and
   a copper alloy seed layer sandwiched in between and in intimate contact with both said body and said electronic device for improving electromigration resistance of said interconnection structure.

2. An interconnection structure according to claim 1, wherein said copper alloy seed layer comprises copper and at least one element selected from the group consisting of Sn, In, Zr, Ti, C, N, O, Cl and S.

3. An interconnection structure according to claim 1, wherein said copper alloy seed layer has a thickness between about 0.1 nm and about 100 nm.

4. An interconnection structure according to claim 1, wherein said copper alloy seed layer has a thickness preferably between about 1 nm and about 100 nm.

5. An interconnection structure according to claim 1, wherein said copper alloy seed layer is formed of a metal compound, a metal solid solution or a two-phase mixtures of metal phases.

6. An interconnection structure according to claim 1, wherein said copper alloy seed layer is a copper containing about 0.5 atomic % of Sn or In.

7. An interconnection structure according to claim 1, wherein said structure is used either on-chip or off-chip.

8. An interconnection structure according to claim 1, wherein said structure is a member selected from the group consisting of a via, a line, a stud and a wiring lead for TAB, BGA or PGA.

9. An interconnection structure according to claim 1, wherein said interconnection structure is a multi-level structure having between 2 and 10 wiring levels.

10. An interconnection structure according to claim 1, wherein said interconnection structure is built on a previously deposited layer of metal silicide or W stud and W local interconnections.

11. An interconnection structure for providing electrical connection to an electronic device comprising:
a copper conductor body, and
a copper alloy seed layer sandwiched in between and in intimate contact with both said copper conductor body and a diffusion barrier layer formed on said electronic device for improving adhesion to said underlying diffusion barrier layer, said copper alloy seed layer comprises copper and at least one element selected from the group consisting of Al, Mg, Be, Ca, Sr, Ba, Sc, Y, La, Ce, Pr, Nd, Sm, Eu, Gd, Pb, Dy, Ho, Er, Tm, Yb, Lu, Si and Ge.

12. An interconnection structure according to claim 11, wherein said copper alloy seed layer has an electrical resistivity larger than the electrical resistivity for the copper conductor body.

13. An interconnection structure according to claim 11, wherein said copper alloy seed layer has a thickness between about 0.1 nm and about 100 nm.

14. An interconnection structure according to claim 11, wherein copper conductor body is formed substantially of copper is formed by copper and between about 0.001 and about 10 weight percent of at least one alloying element selected from the group consisting of C, N, Cl and O.

15. An interconnection structure according to claim 11, wherein said copper alloy seed layer is formed of a metal compound, a metal solid solution or a two-phase mixtures of metal phases.

16. An interconnection structure according to claim 11, wherein said structure is a member selected from the group consisting of a via, a line, a stud and a wiring lead for TAB, BGA or PGA.

17. An interconnection structure according to claim 11, wherein said interconnection structure is a multi-level structure having between 2 and 10 wiring levels.

18. An interconnection structure according to claim 11, wherein said interconnection structure is built on a previously deposited layer of metal silicide.

19. An interconnection system for providing electrical connection to an electronic device comprising:
a copper conductor body, and
a copper alloy seed layer sandwiched in between and in intimate contact with both said copper conductor body and said electronic device for improving the surface properties of the electronic device, said copper alloy seed layer comprises copper and at least one element selected from the group consisting of B, O, N, P, Fe, Ru, Os, Co, Rh, Ir, Ni, Pd, Pt, Ag, Au, Zn and Cd.

20. An interconnection system according to claim 19, wherein said copper alloy seed layer has a thickness between about 0.1 nm and about 100 nm.

21. An interconnection system according to claim 19, wherein said structure is a member selected from the group consisting of a via, a line, a stud and a wiring lead for TAB, BGA or PGA.

22. An interconnection system according to claim 19, wherein said copper conductor body formed substantially of copper is formed by copper and between about 0.001 and about 10 weight percent of at least one alloying element selected from the group consisting of C, N, O, Cl and S.

23. An interconnection system according to claim 19, wherein said copper alloy seed la-phase mixtures of metal phases.

24. An interconnection system for providing electrical connection to an electronic device comprises:
a copper conductor body, and
a metal seed layer sandwiched in between and in intimate contact with both said copper conductor body and said electronic device for improving the copper conductor deposition process, said metal seed layer is deposited of a metal which has a solubility in copper so low such that substantially no copper compounds can be formed, said metal seed layer having a thickness between about 0.1 nm and about 100 nm.

25. An interconnection system according to claim 24, wherein said diffusion barrier layer is deposited of a material selected from the group consisting of Ti, Ta, Nb, Mo, TaN, W, WN, TiN, TaSiN, WSiN, TiAlN and TiSiN.

26. An interconnection system according to claim 24, wherein said structure is used either on-chip or off-chip.

27. An interconnection structure according to claim 24, wherein said structure is a member selected from the group consisting of a via, a line, a stud and a wiring lead for TAB, BGA or PGA.

28. An interconnection structure according to claim 24, wherein said interconnection structure is a multi-level structure having between 2 and 10 wiring levels.

29. An interconnection system according to claim 24, wherein said metal has an electrical resistivity substantially similar to the electrical resistivity of copper.

30. An interconnection system according to claim 24, wherein said metal is selected from the group consisting of Ag, Mo, W and Co.

* * * * *